(12) United States Patent
Mizuno

(10) Patent No.: US 8,482,195 B2
(45) Date of Patent: Jul. 9, 2013

(54) DISPLAY APPARATUS

(75) Inventor: Nobutaka Mizuno, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 12/914,671

(22) Filed: Oct. 28, 2010

(65) Prior Publication Data

US 2011/0101855 A1 May 5, 2011

(30) Foreign Application Priority Data

Nov. 5, 2009 (WO) .................. PCT/JP2009/068930

(51) Int. Cl.
*H01J 1/62* (2006.01)

(52) U.S. Cl.
USPC .......................................... 313/506; 313/509

(58) Field of Classification Search
USPC ................................................. 313/498–512
See application file for complete search history.

(56) References Cited

U.S. PATENT DOCUMENTS

| 6,660,409 B1 | 12/2003 | Komatsu et al. | |
| 2003/0085652 A1 | 5/2003 | Weaver | |
| 2005/0140286 A1 | 6/2005 | Ito | |
| 2005/0269588 A1* | 12/2005 | Kim et al. | 257/99 |
| 2006/0102912 A1* | 5/2006 | Abe et al. | 257/88 |
| 2006/0113907 A1 | 6/2006 | Im | |
| 2006/0269731 A1* | 11/2006 | Yoshikawa et al. | 428/212 |
| 2008/0203908 A1 | 8/2008 | Hasegawa | |
| 2009/0218943 A1 | 9/2009 | Nishimura | |

FOREIGN PATENT DOCUMENTS

| JP | 2002-025765 A | 11/2002 |
| JP | 2003-151761 A | 5/2003 |
| JP | 2005-158374 A | 6/2005 |
| JP | 2006-505092 A | 2/2006 |
| JP | 2006-114438 A | 4/2006 |
| JP | 2006-156390 A | 6/2006 |
| JP | 2007-12410 A | 1/2007 |
| JP | 2008-210665 A | 9/2008 |
| JP | 2008-243379 A | 10/2008 |
| JP | 2009-211877 A | 9/2009 |

* cited by examiner

*Primary Examiner* — Bumsuk Won
(74) *Attorney, Agent, or Firm* — Canon U.S.A., Inc., IP Division

(57) ABSTRACT

Provided is a display apparatus that uses a sealing configuration with a protective layer and in which the luminous efficiency of an organic electroluminescent element that emits blue light is improved. A display apparatus includes a plurality of organic electroluminescent elements (11, 12, 13), a protective layer 6, and an optical adjustment layer 5 including a first optical adjustment layer and a second optical adjustment layer.

18 Claims, 3 Drawing Sheets

DISPLAY APPARATUS

TECHNICAL FIELD

The present invention relates to a display apparatus, and in particular, to an improvement in luminous efficiency.

BACKGROUND ART

An organic electroluminescent element includes a first electrode disposed on a substrate, an organic compound layer including a light-emitting layer, and a second electrode, which are stacked on top of each other. Improvement in the luminous efficiency is required for organic electroluminescent elements. To address this issue, PTL 1 describes an organic electroluminescent element that achieves a high efficiency by having an organic capping layer stacked in an upper part of the organic electroluminescent element.

Organic electroluminescent elements are prone to corrosion and oxidation. Therefore, it is necessary to seal organic electroluminescent elements. Sealing configurations are classified into two types. In one type of configuration, an organic electroluminescent element is filled with dry air and sealed with a sealing cap. In the other type of configuration, an organic electroluminescent element is covered with a protective layer that is not permeable to water and oxygen. PTL 2 describes an organic electroluminescent element that is covered with a protective layer made of silicon oxynitride (SiON)/organic material/silicon oxynitride (SiON).

When the sealing configuration with the protective layer is used in the organic electroluminescent element described in PTL 1, in which an organic capping layer is stacked in the upper part of the organic electroluminescent element, the difference in the refractive indices at the interface between the organic capping layer and the protective layer is not large. Therefore, it is difficult to produce an effect described in PTL 1 when the sealing configuration with the protective layer is used.

CITATION LIST

Patent Literature

PTL 1 Japanese Patent Laid-Open No. 2006-156390
PTL 2 Japanese Patent Laid-Open No. 2002-025765

An object of the present invention is to provide a display apparatus that uses a sealing configuration with a protective layer and with which the luminous efficiency is improved.

SUMMARY OF THE INVENTION

According to the present invention, a display apparatus includes a plurality of organic electroluminescent elements and a protective layer, each of the plurality of organic electroluminescent elements including a first electrode, an organic compound layer and a second electrode, the organic compound layer including a light-emitting layer, the protective layer covering the plurality of organic electroluminescent elements, and the plurality of organic electroluminescent elements including an organic electroluminescent element that emits light of blue color, an organic electroluminescent element that emits light of green color, and an organic electroluminescent element that emits light of red color, and the display apparatus comprises a first optical adjustment layer and a second optical adjustment layer that are disposed between the second electrode and the protective layer, the first optical adjustment layer being in contact with the second electrode, and the second optical adjustment layer being in contact with the first optical adjustment layer, wherein the first optical adjustment layer and the second optical adjustment layer have refractive indices that are different from each other, extend over the plurality of organic electroluminescent elements, and each have a thickness that is uniform, the thicknesses being determined so that, for light that is emitted by the light-emitting layer of the organic electroluminescent element that emits light of blue color, a phase of the light when the light is reflected by an interface between the second electrode and the first optical adjustment layer, a phase of the light when the light is reflected by an interface between the first optical adjustment layer and the second optical adjustment layer, and a phase of the light when the light is reflected by an interface on the protective layer side of the second optical adjustment layer are the same.

Further features of the present invention will become apparent from the following description of exemplary embodiments with reference to the attached drawings.

DESCRIPTION OF EMBODIMENTS

Hereinafter, an organic electroluminescent element and a display apparatus according to embodiments of the present invention will be described with reference to the drawings. In the parts that are not illustrated or described in the present description, well-known or known technologies in the technical field are used. The present invention is not limited to the embodiments described below.

Figure 1A:
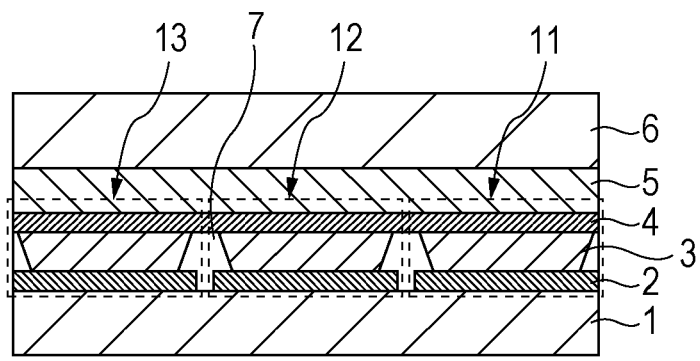
FIGS. 1A to 1C are schematic views of an embodiment of the present invention.

FIG. 1A is a schematic sectional view of a display apparatus according to the present invention. The display apparatus includes a substrate 1, an organic electroluminescent element 11 that emits light of blue color, an organic electroluminescent element 12 that emits light of green color, and an organic electroluminescent element 13 that emits light of red color. The organic electroluminescent elements are disposed on the substrate 1. Each of the organic electroluminescent elements sequentially includes a first electrode 2, an organic compound layer 3 including a light-emitting layer, and a second electrode 4. A protective layer 6 is disposed on the organic electroluminescent elements. Light that is emitted by the organic electroluminescent elements is emitted from the second electrode 4 side. Partitions 7 are disposed between the organic electroluminescent elements.

An optical adjustment layer 5 is disposed between the second electrode 4 and the protective layer 6, which are stacked in a direction perpendicular to the substrate 1. The optical adjustment layer 5 includes a plurality of layers, and adjacent layers have refractive indices that are different from each other. This structure has been found through comparison between the sealing configurations described below.

Figure 2:
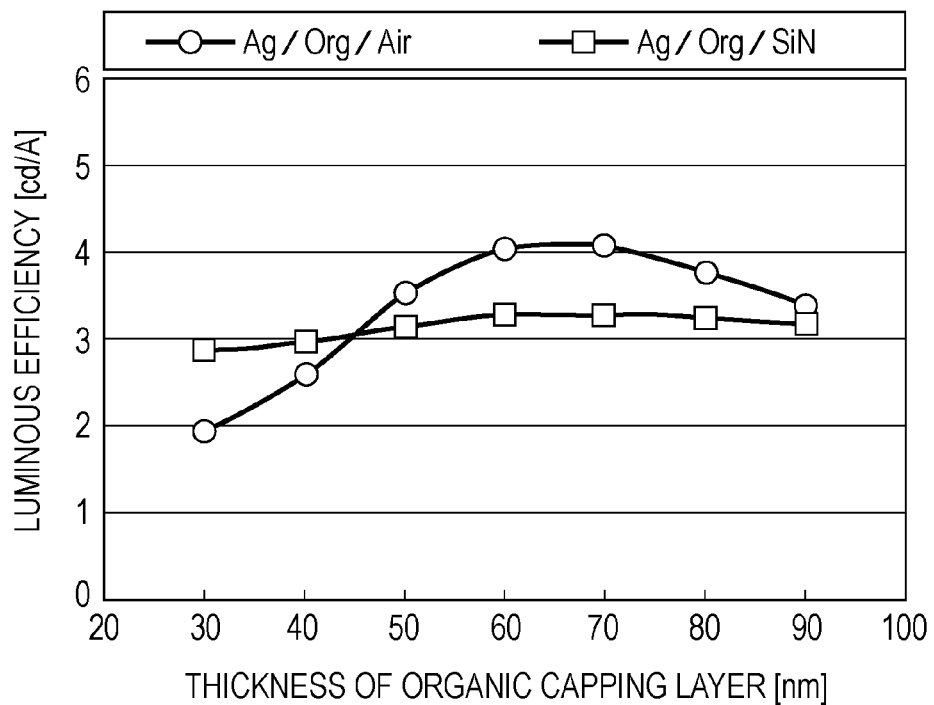
FIG. 2 is a graph illustrating the relationship between the thickness of an organic capping layer and the luminous efficiency for two types of sealing configurations.

To be specific, for an organic electroluminescent element including an organic capping layer stacked in an upper part of the second electrode 4, a configuration that uses a sealing cap for sealing is compared with a configuration that uses a protective layer for sealing. Referring to FIG. 2, the comparison will be described. FIG. 2 illustrates the relationship between the thickness of the organic capping layer and the luminous efficiency of an organic electroluminescent element that emits light of blue color. When a sealing cap is used for sealing (shown by circles in FIG. 2), the difference between the refractive indices of the organic capping layer and dry air is large. Therefore, the reflectance at the interface between the organic capping layer and the dry air is high, and the efficiency changes due to an effect of an optical interference that intensifies light of blue color in the organic capping layer. In contrast, when a protective layer is used for sealing (shown by squares in FIG. 2), the thickness of the organic capping layer has only a small effect on the luminous efficiency. This is because, the difference between the refractive indices of the organic capping layer and the protective layer is small, so that the reflectance at the interface between the organic capping layer and the protective layer is low, whereby the optical interference effect that intensifies light of blue color in the organic capping layer is not sufficiently produced. The refractive indices of the materials are approximately 1.8 for the organic capping layer ($Alq_3$), 1.0 for the dry air (air), and 1.8 for the protective layer (SiN). The refractive index of the protective layer varies in the range from 1.6 to 2.1 depending on the deposition method, the deposition condition, and the deposition atmosphere. However, the difference between the refractive indices of the organic capping layer and the protective layer is smaller than the difference between the refractive indices of the organic capping layer and the dry air.

Therefore, the present invention uses an optical adjustment layer including a plurality of layers having different refractive indices between adjacent layers. With such a structure, a plurality of reflective surfaces are formed in the optical adjustment layer, and the luminous efficiency can be improved by using optical interference between light reflected by the reflective surfaces and light emitted by the light-emitting layer of the organic electroluminescent element. In this case, it is desirable that the difference between the refractive indices of adjacent layers be equal to or larger than 0.2.

The optical adjustment layer 5 and the protective layer 6 extend over a plurality of organic electroluminescent elements (organic electroluminescent element 11, organic electroluminescent element 12, and organic electroluminescent element 13), and the optical adjustment layer 5 and the protective layer 6 each have a uniform thickness. With this structure, it is not necessary to perform patterning for each color of light emitted by the organic electroluminescent element, whereby the process is simplified. The thicknesses of the layers included in the optical adjustment layer 5 are determined so that the layers have a high reflectance of light of blue color (in the wavelength range of 400 nm to 500 nm). To be specific, for light that is emitted in a light-emitting layer of an organic electroluminescent element that emits light of blue color, the total reflectance of the optical adjustment layer is increased by making the phases of the light when the light is reflected by the interfaces between the layers included in the optical adjustment layer 5 and the phase of the light when the light is reflected by the interface between the optical adjustment layer 5 and the second electrode 4 be the same. Two phases are assumed to be the same when the difference between the phases is equal to or smaller than $\pi/4$.

One reason for setting the optical adjustment layer 5 so as to increase the reflectance of light in the blue wavelength band is that development of light-emitting materials that emit light of blue color has not been sufficiently progressed as compared with light-emitting materials that emit light of other colors. Therefore, the luminous efficiency of light of blue color is lower than that of light of green color, for which development of phosophorescent materials has progressed. Moreover, the life of blue light-emitting materials is shorter than those of materials for other colors. By improving the light emissive efficiency by using the optical interference due to the optical adjustment layer, the driving current can be reduced and thereby the life of the blue light-emitting material can be increased.

Figure 3:
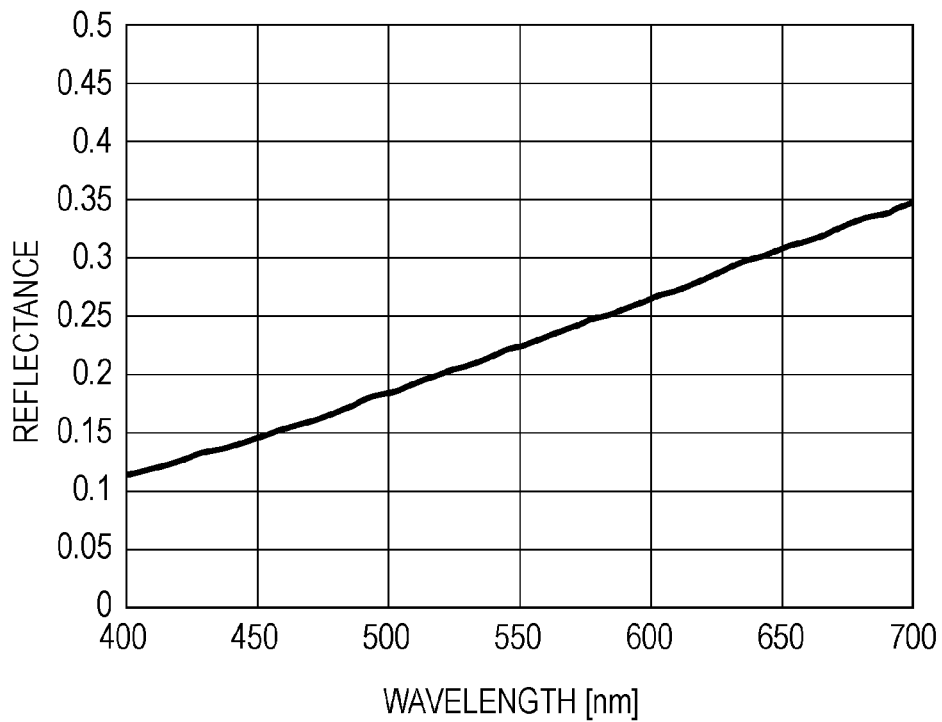
FIG. 3 is a graph illustrating the wavelength dispersion of the reflectance of a thin silver film.

Another reason is that, when the second electrode, which serves as a light-emissive electrode, is made by a thin metallic film having a thickness in the range from 5 nm to 20 nm, the reflectance of the second electrode is low in a short-wavelength band. FIG. 3 is a graph illustrating the wavelength dispersion of the reflectance of a thin silver film having a thickness of 10 nm. As can be seen from this graph, the reflectance in a short wavelength range is lower that the reflectance in a long wavelength range. Therefore, the interference effect is small for the organic electroluminescent element that emits light of blue color, whereby light emissive efficiency is relatively lower than those for other colors. This phenomenon is prominent when a thin metallic film including silver is used. However, the thin metallic film is not limited to a thin silver film or a metallic film including silver, because, a thin metallic film having a thickness in the range from 5 nm to 20 nm generally has a lower reflectance in a shorter wavelength range.

The organic electroluminescent element according to the present invention can also be used in a case in which light is intensified by using optical interference that occurs between light that is emitted by a light-emitting layer included in the organic compound layer 3 and reflected by a reflective surface of the first electrode 2 and light that is emitted by the light-emitting layer and reflected by a reflective surface of the second electrode 4. In this case, the optical length L between the reflective surface of the first electrode 2 and the reflective surface of the second electrode 4 is set so as to satisfy the following expression 1. In expression 1, $\lambda$ is the maximum peak wavelength of the spectrum of light emitted from the organic electroluminescent element, $\theta$ is the sum of a phase shift amount at the reflective surface of the first electrode 2 and the phase shift amount at the reflective surface of the second electrode 4, and N is a natural number. The optical length is the product of the thickness of a layer and the difference in the refractive index.

$$2L/\lambda + \theta/2\pi = N \qquad \text{expression 1}$$

However, expression 1 may not be satisfied due to a deposition error that may occur when depositing the organic compound layer 3. Nevertheless, even if the optical length L deviates by about $\pm\lambda/8$ from the position satisfying expression 1, the optical interference that occurs between the reflective surface of the first electrode 2 and the reflective surface of the second electrode 4 is an interference that intensifies light at the wavelength $\lambda$. Therefore, it is sufficient that the optical length L between the reflective surface of the first electrode 2 and the reflective surface of the second electrode 4 satisfy the following expression 1'. Hereinafter, an organic electroluminescent element that satisfies expression 1' will be referred to as an organic electroluminescent element having a resonator structure. For the organic electroluminescent element having a resonator structure, it is preferable that the thickness of the organic layer be determined in accordance with an emission spectrum.

$$(4N-2\theta/\pi-1)\lambda/8 < L < (4N-2\theta/\pi+1)\lambda/8 \qquad \text{expression 1'}$$

It is more preferable that the optical length L be within ±λ/16 from the range represented by expression 1.

The substrate 1 is an insulating substrate made of glass, plastic, or the like, and TFTs or other switching elements (not shown) are formed thereon.

As the first electrode 2, a metallic layer made of a metal such as Al, Cr, or Ag or an alloy thereof can be used. Alternatively, a transparent conductive oxide layer, such as a layer made of a compound of indium oxide and tin oxide or a layer made of a compound of indium oxide and zinc oxide, may be stacked on a metallic layer. If the first electrode 2 includes only a metallic layer, the reflective surface of the first electrode 2 is an interface between the metallic layer (first electrode 2) and the organic compound layer 3. If the first electrode 2 includes a metallic layer and a transparent conductive oxide layer, the reflective surface of the first electrode 2 is an interface between the metallic layer and the transparent conductive oxide layer. It is preferable that the thickness of the first electrode 2 be in the range from 50 nm to 200 nm. The term "transparent" means that light transmittance is equal to or higher than 50% in the visible light range (wavelength in the range from 400 nm to 780 nm).

The organic compound layer 3 at least includes a light-emitting layer. As necessary, the organic compound layer 3 may include a charge transport layer, such as a hole transport layer or an electron transport layer, a hole blocking layer, and the like. The layers may be made of known materials. The layers may be formed by using known deposition methods, such as vapor deposition and transcription. By optimizing the thickness of the organic compound layer for each color of emitted light, the luminous efficiency of the organic electroluminescent element for each color can be increased.

As the second electrode 4, a transparent conductive oxide layer, such as a compound layer of indium oxide and tin oxide and a compound layer of indium oxide and zinc oxide, or a thin metallic film made of a metal, such as Al, Cr, and Ag, or an alloy thereof, may be used. In particular, it is preferable that the second electrode 4 be a thin metallic film including silver, because such a film has a low absorptance and a low resistivity. When a thin metallic film is used as the second electrode 4, it is preferable that the thickness be in the range from 5 nm to 20 nm. When the second electrode 4 is a metallic layer, the reflective surface of the second electrode 4 is an interface between the metallic layer (second electrode 4) and the organic compound layer 3. When the second electrode 4 is a transparent conductive oxide layer, the reflective surface of the first electrode 2 is an interface between the transparent conductive oxide layer and the optical adjustment layer 5.

The protective layer 6 may be made from a known material by using a known deposition method. For example, the protective layer 6 may be made by depositing silicon nitride (SiN) by using a CVD system. Alternatively, titanium oxide may be used. In general, the thickness of the protective layer 6 is on the order of microns so that a sealing function is performed and so that an optical interference effect is not produced.

The material of the optical adjustment layer 5 is not particularly limited, and may be an organic material or an inorganic material. For example, $SiO_2$, $TiO_2$, LiF, $MgF_2$, $CF_x$, or one of the materials of the organic compound layer 3 may be used. However, it is preferable that the difference between the refractive indices of adjacent optical adjustment layers be large (the difference between the refractive indices be equal to or larger than 0.2) because, in such a case, the reflectance is high and optical adjustment can be easily performed. A reflectance R of light at the interface between a medium having a refractive index $n_A$ and a medium having a refractive index $n_B$ is represented by expression 2.

$$R = (n_A - n_B)^2 / (n_A + n_B)^2 \qquad \text{expression 2}$$

It is desirable that the optical adjustment layer include high-refractive-index layers (having a refractive index higher than 1.7) and low-refractive-index layers (having a refractive index equal to or lower than 1.7) that are alternately stacked. It is preferable that the refractive index of a layer of the optical adjustment layer that is in contact with the protective layer 6 be higher than the refractive index of the protective layer 6, and the difference in the refractive indices thereof be equal to or larger than 0.5.

First Embodiment

Figure 1B:
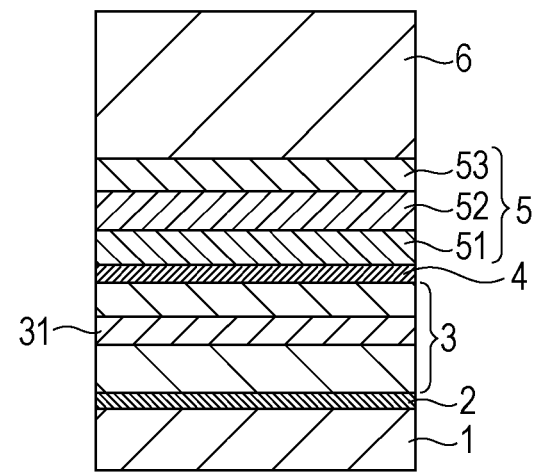

Referring to FIG. 1B, a first embodiment will be described. FIG. 1B is a detailed sectional view of an organic electroluminescent element. The organic electroluminescent element includes, in sequence, the first electrode 2, the organic compound layer 3 including a light-emitting layer 31, and the second electrode 4. The optical adjustment layer 5 and the protective layer 6 are disposed on the second electrode 4. The optical adjustment layer 5 and the protective layer 6 extend over a plurality of organic electroluminescent elements, and the layers 5 and 6 each have a uniform thickness.

As illustrated in FIG. 1B, the optical adjustment layer 5 includes a first optical adjustment layer 51 that is in contact with the second electrode 4, a second optical adjustment layer 52 that is in contact with the first optical adjustment layer 51, and a third optical adjustment layer that is in contact with the second optical adjustment layer 52 and the protective layer 6. The first optical adjustment layer 51, the second optical adjustment layer 52, and the third optical adjustment layer 53 extend over a plurality of organic electroluminescent elements, and the layers 51 to 53 each have a uniform thickness. The first optical adjustment layer 51 and the second optical adjustment layer 52 have refractive indices that are different from each other, and the second optical adjustment layer 52 and the third optical adjustment layer 53 have refractive indices that are different from each other. It is preferable that the difference between the refractive indices of the first optical adjustment layer 51 and the second optical adjustment layer 52 be equal to or larger than 0.2. It is preferable that the difference between the refractive indices of the second optical adjustment layer 52 and the third optical adjustment layer 53 be equal to or larger than 0.2. It is preferable that the refractive indices of the first optical adjustment layer 51 and the third optical adjustment layer 53 be higher than 1.5, and that the refractive index of the second optical adjustment layer 52 be equal to or lower than 1.5. It is preferable that the refractive indices be as described above, because the layers of the optical adjustment layer can form refractive surfaces having a higher reflectance therebetween or between the layers and the protective layer.

It is preferable that the optical adjustment layer 5 include low-refractive-index layers (having a refractive index equal to or lower than 1.5) and high-refractive-index layers (having a refractive index equal to or higher than 1.7) that are alternately stacked, so that the reflectance can be easily increased. In this case, with consideration of the reflection by an interface and phase shift amount due to transmission, the thicknesses $d_2$ and $d_3$ of the second optical adjustment layer 52 and the third optical adjustment layer 53 respectively satisfy expression 3 and expression 4. In these expressions, λ is the maximum peak wavelength of the spectrum of light that is emitted from the organic electroluminescent element that emits light of blue color, and $n_2$ and $n_3$ are respectively the refractive indices of the second optical adjustment layer and the third optical adjustment layer at the maximum peak wavelength $\lambda$. $m_2$ and $m_3$ are natural numbers. The maximum peak wavelength of light emitted from the blue organic electroluminescent element, which depends on the light-emitting material, is in the range from about 430 nm to 480 nm.

$$d_2 = (2m_2-1)\lambda/4n_2 \quad \text{expression 3}$$

$$d_3 = (2m_3-1)\lambda/4n_3 \quad \text{expression 4}$$

According to the present invention, even if the thicknesses $d_2$ and $d_3$ deviate by about $\pm\lambda/8$ from the values that satisfy expression 3 and expression 4, the reflectance of the optical adjustment layer can be improved. Therefore, it is sufficient that the thicknesses $d_2$ and $d_3$ of the second optical adjustment layer 52 and the third optical adjustment layer 53 respectively satisfy expression 3' and expression 4'.

$$(4m_2-3)\lambda/(8n_2) < d_2 < (4m_2-1)\lambda/(8n_2) \quad \text{expression 3'}$$

$$(4m_3-3)\lambda/(8n_3) < d_3 < (4m_3-1)\lambda/(8n_3) \quad \text{expression 4'}$$

It is more preferable that the thicknesses $d_2$ and $d_3$ be in ranges that are deviated by about $\pm\lambda/16$ from the values that satisfy expression 3 and expression 4.

It is sufficient that the thickness of the first optical adjustment layer 51 be a thickness that allows reflection by the interface between the first optical adjustment layer 51 and the second optical adjustment layer 52 to function appropriately. To be specific, it is sufficient that the maximum peak wavelength $\lambda$ of the spectrum of light that is emitted from the organic electroluminescent element that emits light of blue color and the optical length $t_1$ between the interface between the first optical adjustment layer 51 and the second optical adjustment layer 52 and a luminous point in the light-emitting layer 31 satisfies expression 5. $\phi_1$ is an amount of phase shift that occurs when light emitted by an organic electroluminescent element that emits light of blue color is reflected by the interface between the first optical adjustment layer 51 and the second optical adjustment layer 52, and $m_1$ is a natural number. If emission by the organic electroluminescent element has a distribution, the luminous point is a maximal point of the light intensity distribution.

$$2t_1/\lambda + \phi_1/2\pi = m_1 \quad \text{expression 5}$$

According to the present invention, even if the optical length $t_1$ is deviated by about $\pm\lambda/8$ from expression 5, the reflectance of the optical adjustment layer can be improved. Therefore, it is sufficient that the optical length $t_1$ satisfy expression 5'.

$$(4m_1-2\phi_1/\pi-1)\lambda/8 < t_1 < (4m_1-2\phi_1/\pi+1)\lambda/8 \quad \text{expression 5'}$$

In an organic electroluminescent element having a resonator structure, if the second electrode is made of a thin metallic film, the organic electroluminescent element and the first optical adjustment layer 51 can be separated to different optical interferences. Therefore, in the organic electroluminescent element having a resonator structure, the thickness $d_1$ of the first optical adjustment layer satisfies expression 6 below. Here, $\lambda$ is the maximum peak wavelength spectrum of light that is emitted from the organic electroluminescent element that emits light of blue color, and $n_1$ is the refractive index of the first optical adjustment layer 51 at the maximum peak wavelength $\lambda$.

$$2n_1d_1/\lambda + \phi_1/2\pi = m_1 \quad \text{expression 6}$$

Even if deviation from the expression 6 by about $\pm\lambda/8$ exists, the reflectance of the optical adjustment layer can be improved. Therefore, it is sufficient that the thickness $d_1$ of the first optical adjustment layer 51 satisfy expression 6'.

$$(4m_1-2\phi_1/\pi-1)\lambda/(8n_1) < d_1 < (4m_1-2\phi_1/\pi+1)\lambda/(8n_1) \quad \text{expression 6'}$$

It is more preferable that the thickness $d_1$ be in the range that is deviated by about $\pm\lambda/16$ from the value that satisfies expression 6.

When the thickness $d_1$ of the first optical adjustment layer 51 and the thickness $d_2$ of the second optical adjustment layer 52 respectively satisfy expression 6' and expression 3', the following holds true. That is, for light that is generated by the light-emitting layer of the blue organic electroluminescent element, the phase of the light when the light is reflected by the interface between the second electrode 4 and the first optical adjustment layer 51 and the phase of the light when the light is reflected by the interface between the first optical adjustment layer 51 and the second optical adjustment layer 52 are the same. Moreover, for the light that is generated by the light-emitting layer of the blue organic electroluminescent element, the above phases are the same as the phase of the light reflected by the interface between the second optical adjustment layer 52 and the third optical adjustment layer 53 (the interface on the protective layer side of the second optical adjustment layer 52). Therefore, the total reflectance with which the optical adjustment layer reflects light that is generated by the light-emitting layer 31 of the blue organic electroluminescent element is increased, whereby the luminous efficiency is improved. In particular, when expression 6' and expression 3' are satisfied, the reflectance of the optical adjustment layer with respect to the wavelength $\lambda$ is improved, whereby the luminous efficiency can be improved. Moreover, when the thickness $d_3$ of the third optical adjustment layer 53 satisfies expression 4', for light that is emitted by the light-emitting layer of the blue organic electroluminescent element toward the protective layer, the phases of the light when the light is reflected by the interfaces described above and the phase of the light when the light is reflected by the interface between the third optical adjustment layer 53 and the protective layer 6 are the same. Therefore, the luminous efficiency of the blue organic electroluminescent element is further improved.

The phase shift amount $\phi_1$ depends on the refractive indices of the first optical adjustment layer 51 and the second optical adjustment layer 52. That is, if the refractive index of the first optical adjustment layer 51 is higher than the refractive index of the second optical adjustment layer 52, the phase shift amount $\phi_1$ is $\pi$ and the phase shift amount $\phi_1$ is zero in the opposite case.

When the layers of the optical adjustment layer satisfy the expressions described above, the phase of the light when the light is reflected by the interface between the layers, the phase of the light when the light is reflected by the interface between the optical adjustment layer and the second electrode, and the phase of the light when the light is reflected by the interface between the optical adjustment layer and the protective layer are made to be the same.

An example of the present embodiment will be described below. In the example, the thickness of the first optical adjustment layer 51 was adjusted so as to increase the luminous efficiency of a blue organic electroluminescent element having an emission spectrum having the maximum peak wavelength at 460 nm. The first optical adjustment layer 51, the second optical adjustment layer 52, and the third optical adjustment layer 53 were respectively made of $Alq_3$, $SiO_2$, and indium zinc oxide, and the protective layer 6 was made of SiN. Table 1 illustrates the refractive indices of the optical adjustment layer and the protective layer at a wavelength of 460 nm. The refractive indices may be calculated by using an optical apparatus such as a spectroscopic ellipsometry. As illustrated in Table 1, the thickness of the second optical adjustment layer 52 was set so as to satisfy expression 3' for $m_2=1$, and the thickness of the third optical adjustment layer 53 was set so as to satisfy expression 4' for $m_3=2$.

From the relationship between the refractive index of the first optical adjustment layer 51 and the refractive index of the second optical adjustment layer 52, $\phi_1=0$. Therefore, it is sufficient that the optical length $t_1$ between the luminous point and the interface between the first optical adjustment layer 51 and the second optical adjustment layer 52 of about 230 nm satisfy expression 5 for the natural number $m_1=1$. In the present embodiment, with consideration of the optical interference, the optical length between the luminous point (in this example, the interface of the light-emitting layer 31 on the first electrode 2 side) and the interface between the second electrode 4 and the first optical adjustment layer 51 was set to be about 122 nm, so that the optical length of the first optical adjustment layer 51 was about 108 nm. In the present embodiment, the refractive index of the first optical adjustment layer was 1.8, so that the thickness of the layer was about 60 nm so as to make the optical length be about 108 nm. The thickness of the layer satisfies expression 6'.

TABLE 1

| | Material | Refractive Index | Thickness [nm] |
|---|---|---|---|
| Protective Layer | SiN | 1.8 | 10000 |
| Third Optical Adjustment Layer | IZO | 2.2 | 180 |
| Second Optical Adjustment Layer | SiO$_2$ | 1.5 | 77 |
| First Optical Adjustment Layer | Alq$_3$ | 1.8 | x |
| Second Electrode | Ag | | 12 |

Figure 4A:
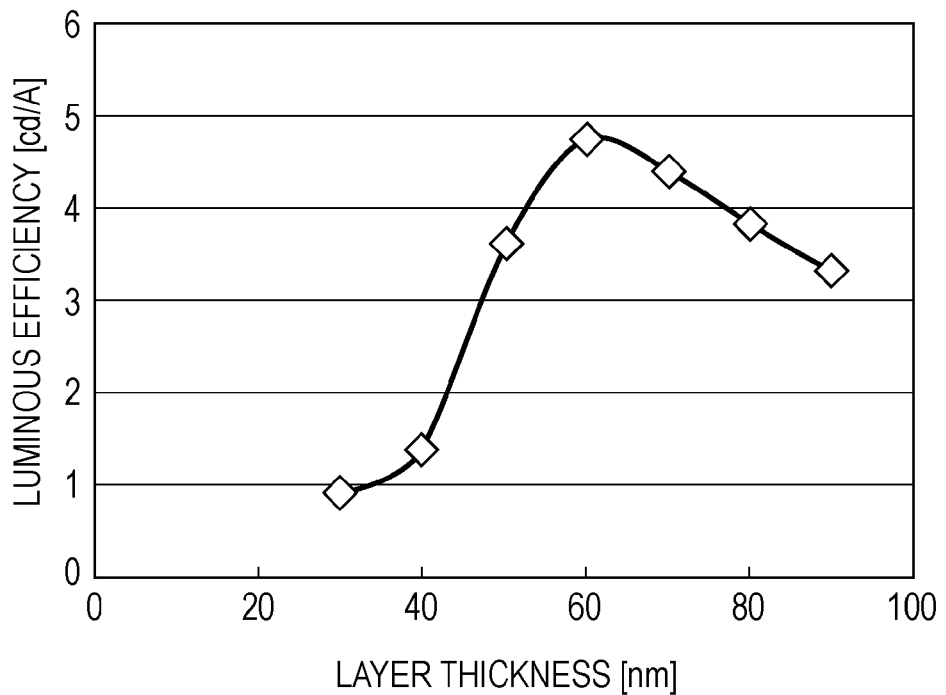
FIGS. 4A and 4B are graphs illustrating the relationship between the thickness of a first optical adjustment layer and the luminous efficiency according to an embodiment of the present invention.

FIG. 4A illustrates the relationship between the thickness of the first optical adjustment layer 51 and the luminous efficiency. When the thickness of the first optical adjustment layer 51 was 60 nm, the luminous efficiency was 4.10 cd/A, which was a maximal value. This is 1.24 times the luminous efficiency in the case when only the organic capping layer is provided. Table 2 illustrates a comparative example 1 in which only the organic capping layer was provided and a comparison of the first embodiment with the comparative example 1 with respect to the efficiencies of the red, green, and blue organic electroluminescent elements and electric currents when light of the colors was emitted so as to display white. Because the present embodiment has a stronger interference on a short wavelength range than the comparative example 1, the efficiency of the blue organic electroluminescent element was increased and the total current of the organic electroluminescent elements when displaying white was reduced, whereby reduction in power consumption was to be expected.

TABLE 2

| | | Red | Green | Blue |
|---|---|---|---|---|
| First Embodiment | Efficiency [cd/A] | 15.3 | 32.8 | 4.1 |
| | Current Ratio | 0.72 | 0.74 | 1.00 |
| Comparative Example 1 | Efficiency [cd/A] | 17.1 | 37.2 | 3.3 |
| | Current Ratio | 0.66 | 0.65 | 1.24 |

Second Embodiment

Figure 1C:
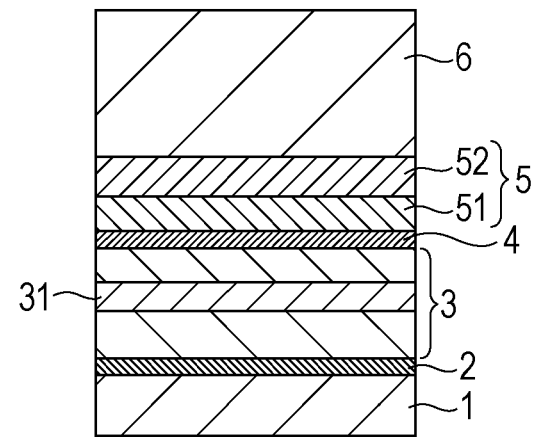

FIG. 1C is a sectional view of an organic electroluminescent element of a display apparatus according to a second embodiment of the present embodiment. The second embodiment differs from the first embodiment in the structure of the optical adjustment layer 5. In other respects, the first and second embodiments are the same. According to the present embodiment, the optical adjustment layer 5 includes the first optical adjustment layer 51, which is in contact with the second electrode 4, and the second optical adjustment layer 52, which is in contact with the first optical adjustment layer 51. The second optical adjustment layer 52 is in contact with the protective layer 6. The first optical adjustment layer 51 and the second optical adjustment layer 52 extend over a plurality of organic electroluminescent elements, and the layers 51 and 52 each with a uniform thickness. The first optical adjustment layer 51 and the second optical adjustment layer 52 have refractive indices that are different from each other. It is preferable that the difference between the refractive indices of the first optical adjustment layer 51 and the second optical adjustment layer 52 be equal to or larger than 0.2. It is preferable that the refractive index of the first optical adjustment layer 51 be equal to or lower than 1.5, and the refractive index of the second optical adjustment layer 52 be higher than 1.5. With such a structure, reflective surfaces having a higher reflectance can be formed between the optical adjustment layers or between an optical adjustment layer and the protective layer.

Also in the present embodiment, it is preferable that the thicknesses of the first optical adjustment layer 51 and the second optical adjustment layer 52 respectively satisfy expression 6 or 6' and expression 3 or 3'. In this case, for light that is emitted by the light-emitting layer of the blue organic electroluminescent element toward the protective layer, the phase of the light when the light is reflected by the interface between the second electrode 4 and the first optical adjustment layer 51 and the phase of the light when the light is reflected by the interface between the first optical adjustment layer 51 and the second optical adjustment layer 52 are the same. Moreover, for the light that is emitted by the light-emitting layer of the blue organic electroluminescent element toward the protective layer, the above phases are the same as the phase of the light when the light is reflected by the interface between the second optical adjustment layer 52 and the protective layer 6 (the interface on the protective layer side of the second optical adjustment layer 52). As a result, as described in the first embodiment, the reflectance of the entire optical adjustment layers is improved, and the luminous efficiency of the organic electroluminescent element that emits light of blue color is improved.

An example of the present embodiment in which a blue organic electroluminescent element having an mission spectrum with a maximum peak wavelength of 460 nm was used and the thickness of the first optical adjustment layer 51 was adjusted so as to increase the luminous efficiency will be described. As illustrated in Table 3, the thickness of the second optical adjustment layer 52 satisfies expression 3' for $m_2=2$.

The first optical adjustment layer 51 and the second optical adjustment layer 52 were made of MgF$_2$ and TiO$_2$, respectively. The protective layer 6 was made of SiN. The refractive indices of the optical adjustment layer and the protective layer at a wavelength of 460 nm are shown in Table 3.

Figure 4B:
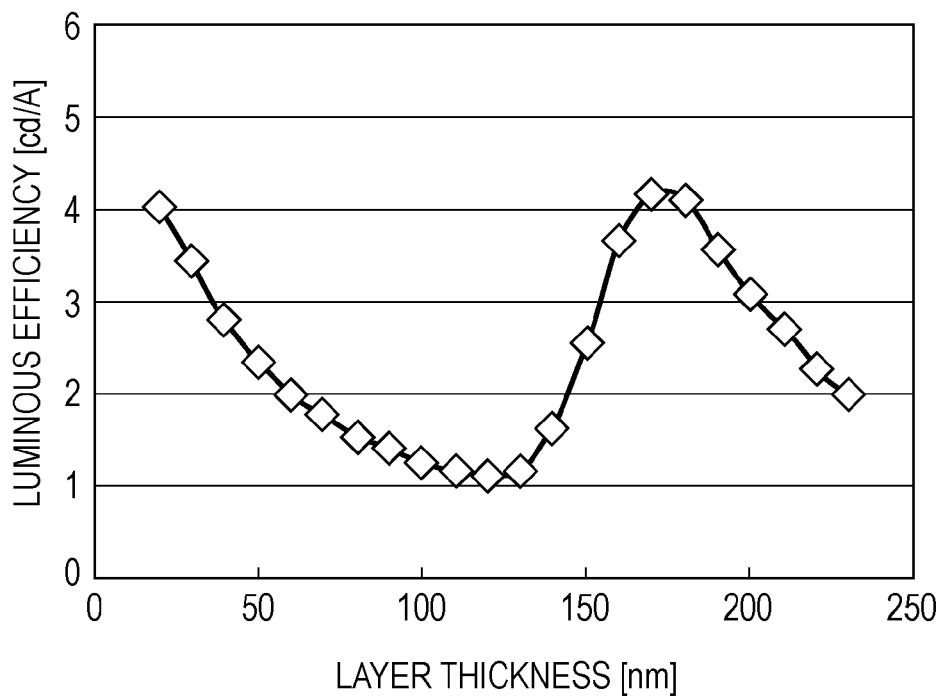

In the present embodiment, $\phi_1=\pi$. Therefore, the optical length $t_1$, which is the distance between the luminous point and the interface between the first optical adjustment layer 51 and the second optical adjustment layer 52 and which satisfies expression 5, may be about 345 nm (about 115 nm). In the present embodiment, as in the first embodiment, the optical length between the luminous point and the interface between the second electrode 4 and the first optical adjustment layer 51 is about 122 nm. Therefore, it is preferable that the optical length of the first optical adjustment layer 51 be about 223 nm (about −7 nm). In the present embodiment, the refractive index of the first optical adjustment layer 51 is 1.4, so that the thickness is about 178 nm (about −5 nm). FIG. 4B illustrates the relationship between the thickness of the first optical adjustment layer 51 and the luminous efficiency. When the thickness of the first optical adjustment layer 51 was about 170 nm, the maximal value of the luminous efficiency was 4.05 cd/A. Also according to the present embodiment, the efficiency of the blue organic electroluminescent element was higher than that of comparative example 1, the total current of the organic electroluminescent elements when displaying white was decreased, whereby reduction in power consumption was to be expected.

The optimal thickness of the first optical adjustment layer 51 calculated using expression 5 is 178 nm. However, in FIG. 4B, the luminous efficiency has an optimal value at 170 nm, probably because the emission has a distribution. The luminous efficiency is high when the thickness of the first optical adjustment layer 51 is small, i.e., equal to or smaller than 30 nm. The luminous efficiency is high when the thickness of the first optical adjustment layer 51 is equal to or smaller than 30 nm, probably because the first optical adjustment layer 51 has an optimal value at around −5 nm. However, it is preferable to provide the first optical adjustment layer 51 to increase the number of refractive surfaces in the optical adjustment layer, and the thickness of the first optical adjustment layer 51 be in the range from 10 nm to 30 nm. When providing the first optical adjustment layer 51 having a thickness equal to or smaller than 10 nm, the layer is not a uniform layer and has a nonuniform thickness. That is, between elements for the same color, a difference in the improvement in the luminous efficiency due to the optical adjustment layer is generated.

TABLE 3

|  | Material | Refractive Index | Thickness [nm] |
| --- | --- | --- | --- |
| Protective Layer | SiN | 1.8 | 10000 |
| Second Optical Adjustment Layer | TiO$_2$ | 2.7 | 120 |
| First Optical Adjustment Layer | MgF$_2$ | 1.4 | x |
| Second Electrode | Ag |  | 12 |

Table 4 illustrates a comparison of luminous efficiency between organic electroluminescent elements that emit light of blue color according to the present invention. Table 5 illustrates a comparative example 1, in which the organic capping layer is disposed between the protective layer and the organic electroluminescent element. Table 6 illustrates a comparative example 2, in which the protective layer is disposed directly above the second electrode of the organic electroluminescent element. It is clear that the present invention increases the luminous efficiency of light of blue color. The unit is [cd/A].

TABLE 4

| First Embodiment | Second Embodiment | Comparative Example 1 | Comparative Example 2 |
| --- | --- | --- | --- |
| 4.1 | 4.05 | 3.3 | 2.81 |

TABLE 5

| Comparative Example 1 | Material | Refractive Index | Thickness [nm] |
| --- | --- | --- | --- |
| Protective Layer | SiN | 1.8 | 10000 |
| Organic Capping Layer | Alq$_3$ | 1.8 | 60 |
| Second Electrode | Ag |  | 12 |

TABLE 6

| Comparative Example 2 | Material | Refractive Index | Thickness [nm] |
| --- | --- | --- | --- |
| Protective Layer | SiN | 1.8 | 10000 |
| Second Electrode | Ag |  | 12 |

In the first and second embodiments, top emission is described. However, the present invention is also effective for bottom emission. In the case of bottom emission, a glass substrate disposed on the light-emissive side corresponds to the protective layer according to the present invention. In the first and second embodiments, the protective layer is made of SiN. However, the material is not limited to SiN, and any known protective layer material may be used.

In the present invention, a part of the protective layer including a plurality of layers may be used as the optical adjustment layer.

The present invention provides a display apparatus that uses a sealing configuration with a protective layer and with which the luminous efficiency is improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Application No. PCT/JP2009/0689360, filed Nov. 5, 2009, which is hereby incorporated by reference herein in its entirety.

The invention claimed is:

1. A display apparatus comprising:
a plurality of organic electroluminescent elements including an organic electroluminescent element that emits light of blue color, and organic electroluminescent element that emits light of green color, and an organic electroluminescent element that emits light of red color, each of the plurality of organic electroluminescent elements including a first electrode, an organic compound layer including a light-emitting layer and a second electrode;
a protective layer covering the plurality of organic electroluminescent elements;
a first optical adjustment layer disposed between the second electrode and the protective layer and disposed in contact with the second electrode; and
a second optical adjustment layer disposed between the second electrode and the protective layer and disposed in contact with the first optical adjustment layer,
wherein light emitted by each of the organic electroluminescent elements is emitted from the second electrode side,
wherein the second electrode is a metal electrode,
wherein the first optical adjustment layer and the second optical adjustment layer have refractive indices that are different from each other, extend over the plurality of organic electroluminescent elements, and each have a thickness that is uniform, the thicknesses being determined so that, for light that is emitted by the light-emitting layer of the organic electroluminescent element that emits light of blue color, a phase of the light when the light is reflected by an interface between the second electrode and the first optical adjustment layer, a phase of the light when the light is reflected by an interface between the first optical adjustment layer and the second optical adjustment layer, and a phase of the light when the light is reflected by an interface on the protective layer side of the second optical adjustment layer are the same, wherein the thickness $d_1$ of the first optical adjustment layer satisfies $$(4m_1-2\phi_1/\pi-1)\lambda/(8n_1) < d_1 < (4m_1-2\phi_1/\pi+1)\lambda/(8n_1),$$

where $\lambda$ is a maximum peak wavelength of a spectrum of light that is emitted from the organic electroluminescent element that emits light of blue color, $n_1$ is the refractive index of the first optical adjustment layer at the maximum peak wavelength $\lambda$, $\phi_1$ is a phase shift amount when the light that is emitted from the organic electroluminescent element that emits light of blue color is reflected by the interface between the first optical adjustment layer and the second optical adjustment layer, and $m_1$ is a natural number, and wherein the thickness $d_2$ of the second optical adjustment layer satisfies $$(4m_2-1)\lambda/(8n_2) < d_2 < (4m_2+1)\lambda/(8n_2),$$

where $\lambda$ is the maximum peak wavelength, $n_2$ is the refractive index of the second optical adjustment layer at the maximum peak wavelength $\lambda$, and $m_2$ is a natural number.

2. The display apparatus according to claim 1, wherein a thickness of the second electrode is in the range from 5 nm to 20 nm.

3. The display apparatus according to claim 1, wherein the second electrode includes silver.

4. The display apparatus according to claim 1, wherein the second optical adjustment layer is in contact with the protective layer, and the refractive index of the second optical adjustment layer is higher than the refractive index of the protective layer.

5. The display apparatus according to claim 1, wherein the difference between the refractive index of the second optical adjustment layer and the refractive index of the protective layer is equal to or larger than 1.0.

6. The display apparatus according to claim 1, wherein the refractive index of the first optical adjustment layer is equal to or lower than 1.5, and the refractive index of the second optical adjustment layer is higher than 1.5.

7. The display apparatus according to claim 1, wherein the difference between the refractive index of the first optical adjustment layer and the refractive index of the second optical adjustment layer is equal to or larger than 0.2.

8. The display apparatus according to claim 1, wherein the refractive index of the second optical adjustment layer is higher than the refractive index of the first optical adjustment layer.

9. The display apparatus according to claim 1, wherein the refractive index of the second optical adjustment layer is lower than the refractive index of the first optical adjustment layer.

10. A display apparatus comprising:

a plurality of organic electroluminescent elements including an organic electroluminescent element that emits light of blue color, an organic electroluminescent element that emits light of green color, and an organic electroluminescent element that emits light of red color, each of the plurality of organic electroluminescent elements including a first electrode, an organic compound layer including a light-emitting layer and a second electrode;

a protective layer covering the plurality of organic electroluminescent elements;

a first optical adjustment layer disposed between the second electrode and the protective layer and disposed in contact with the second electrode;

a second optical adjustment layer disposed between the second electrode and the protective layer and disposed in contact with the first optical adjustment layer, and a third optical adjustment layer that is in contact with the second optical adjustment layer, wherein light emitted by each of the organic electroluminescent elements is emitted from the second electrode side, wherein the second electrode is a metal electrode, wherein the first optical adjustment layer and the second optical adjustment layer have refractive indices that are different from each other, extend over the plurality of organic electroluminescent elements, and each have a thickness that is uniform, the thicknesses being determined so that, for light that is emitted by the light-emitting layer of the organic electroluminescent element that emits light of blue color, a phase of the light when the light is reflected by an interface between the second electrode and the first optical adjustment layer, a phase of the light when the light is reflected by an interface between the first optical adjustment layer and the second optical adjustment layer, and a phase of the light when the light is reflected by an interface on the protective layer side of the second optical adjustment layer are the same, wherein the third optical adjustment layer has a refractive index that is different from the refractive index of the second optical adjustment layer, and wherein a thickness $d_3$ of the third optical adjustment layer satisfies $$(4m_3-1)\lambda/(8n_3) < d_3 < (4m_3+1)\lambda/(8n_3),$$

where $\lambda$ is a maximum peak wavelength of a spectrum of light that is emitted from the organic electroluminescent element that emits light of blue color, $n_3$ is the refractive index of the third optical adjustment layer at the maximum peak wavelength $\lambda$, and $m_3$ is a natural number.

11. The display apparatus according to claim 10, wherein the refractive index of the third optical adjustment layer is higher than the refractive index of the protective layer.

12. The display apparatus according to claim 10, wherein the difference between the refractive index of the third optical adjustment layer and the refractive index of the protective layer is equal to or larger than 1.0.

13. The display apparatus according to claim 10, wherein the refractive index of the first optical adjustment layer is higher than 1.5, the refractive index of the second optical adjustment layer is equal to or lower than 1.5, and the refractive index of the third optical adjustment layer is higher than 1.5.

14. The display apparatus according to claim 10, wherein the difference between the refractive index of the second optical adjustment layer and the refractive index of the third optical adjustment layer is equal to or larger than 0.2.

15. A display apparatus comprising:

a plurality of organic electroluminescent elements including an organic electroluminescent element that emits light of blue color, an organic electroluminescent element that emits light of green color, and an organic electroluminescent element that emits light of red color, each of the plurality of organic electroluminescent elements including a first electrode, an organic compound layer and a second electrode;

a protective layer covering the plurality of organic electroluminescent elements;

a first optical adjustment layer disposed between the second electrode and the protective layer and disposed in contact with the second electrode; and a second optical adjustment layer disposed between the second electrode and the protective layer and disposed in contact with the first optical adjustment layer, wherein light emitted by each of the organic electroluminescent elements is emitted from the second electrode side, wherein the second electrode is a metal electrode, and wherein the first optical adjustment layer and the second optical adjustment layer have refractive indices that are different from each other, extend over the plurality of organic electroluminescent elements, and wherein the thickness $d_1$ of the first optical adjustment layer satisfies $$(4m_1-2\phi_1/\pi-1)\lambda/(8n_1)<d_1<(4m_1-2\phi_1/\pi+1)\lambda/(8n_1),$$

where $\lambda$ is a maximum peak wavelength of a spectrum of light that is emitted from the organic electroluminescent element that emits light of blue color, $n_1$ is the refractive index of the first optical adjustment layer at the maximum peak wavelength $\lambda$, $\phi_1$ is a phase shift amount when the light that is emitted from the organic electroluminescent element that emits light of blue color is reflected by the interface between the first optical adjustment layer and the second optical adjustment layer, and $m_1$ is a natural number, and wherein the thickness $d_2$ of the second optical adjustment layer satisfies $$(4m_2-1)\lambda/(8n_2)<d_2<(4m_2+1)\lambda/(8n_2),$$

where $\lambda$ is the maximum peak wavelength, $n_2$ is the refractive index of the second optical adjustment layer at the maximum peak wavelength $\lambda$, and $m_2$ is a natural number.

16. The display apparatus according to claim 15, wherein the refractive index of the second optical adjustment layer is higher than the refractive index of the first optical adjustment layer.

17. The display apparatus according to claim 15, wherein the refractive index of the second optical adjustment layer is lower than the refractive index of the first optical adjustment layer.

18. The display apparatus according to claim 15, further comprising:

a third optical adjustment layer that is in contact with the second optical adjustment layer, wherein the third optical adjustment layer has a refractive index that is different from the refractive index of the second optical adjustment layer, and a thickness $d_3$ of the third optical adjustment layer satisfies $$(4m_3-1)\lambda/(8n_3)<d_3<(4m_3+1)\lambda/(8n_3),$$

where $\lambda$ is a maximum peak wavelength of a spectrum of light that is emitted from the organic electroluminescent element that emits light of blue color, $n_3$ is the refractive index of the third optical adjustment layer at the maximum peak wavelength $\lambda$, and $m_3$ is a natural number.

* * * * *